(12) United States Patent
McGeoch

(10) Patent No.: US 6,728,337 B2
(45) Date of Patent: Apr. 27, 2004

(54) STAR PINCH PLASMA SOURCE OF PHOTONS OR NEUTRONS

(75) Inventor: Malcolm W. McGeoch, Brookline, MA (US)

(73) Assignee: Plex LLC, Brookline, MA (US)

( * ) Notice: Subject to any disclaimer, the term of this patent is extended or adjusted under 35 U.S.C. 154(b) by 44 days.

(21) Appl. No.: 10/165,998

(22) Filed: Jun. 10, 2002

(65) Prior Publication Data

US 2002/0186815 A1 Dec. 12, 2002

Related U.S. Application Data

(63) Continuation-in-part of application No. 09/876,469, filed on Jun. 7, 2001, now Pat. No. 6,567,499.
(60) Provisional application No. 60/361,118, filed on Mar. 1, 2002.

(51) Int. Cl.[7] .................................................. G21G 4/00
(52) U.S. Cl. ........................................ 378/119; 250/251
(58) Field of Search .......................... 378/119; 250/251; 376/100

(56) References Cited

U.S. PATENT DOCUMENTS

| | | |
|---|---|---|
| 3,258,402 A | 6/1966 | Fansworth |
| 3,386,883 A | 6/1968 | Fansworth |
| 3,530,497 A | 9/1970 | Hirsch et al. |
| 4,401,618 A | 8/1983 | Salisbury |
| 4,682,033 A | 7/1987 | Martin et al. |

(List continued on next page.)

FOREIGN PATENT DOCUMENTS

| | | |
|---|---|---|
| WO | WO 95/30235 A2 | 11/1995 |
| WO | WO 01/91523 A2 | 11/2001 |

OTHER PUBLICATIONS

Malcolm W. McGeoch, "Radio Frequency Pre–ionized Xenon Z–Pinch Source for Extreme Ultraviolet Lithography", Applied Optics, 1998, pp. 1651–1658.

B.I. Kikiani et al, "Resonance Charge Exchange of Inert–Gas Ions in the Energy Range 200–4000eV", Amer. Inst. of Physics, Sov. Phys. Tech. Phys., vol. 20, No. 3, 1975, pp. 364–367.

K.K. Jain et al, "Repetitive High Current Density Pseudospark–Produced Ion Beams", Appl. Phys. Lett., vol. 62, No. 13, Mar. 29, 1993, pp. 1466–1468.

J. Christiansen et al, "Production of High Current Particle Beams by Low Pressure Spark Discharge", Zeitschrift fur Physik A, 290, pp. 35–41, 1979.

*Primary Examiner*—Craig E Church
*Assistant Examiner*—Irakli Kiknadze
(74) *Attorney, Agent, or Firm*—Wolf, Greenfield & Sacks, P.C.

(57) ABSTRACT

A source of photons or neutrons includes a housing that defines a discharge chamber, a first group of ion beam sources directed toward a plasma discharge region in the discharge chamber, the first group of ion beam sources including a first electrode and an inner shell, and a second electrode spaced from the plasma discharge region. The source of photons or neutrons further includes a first power supply for energizing the first group of ion beam sources to electrostatically accelerate toward the plasma discharge region ion beams which are at least partially neutralized before they enter the plasma discharge region, and a second power supply coupled between the first and second electrodes for delivering a heating current to the plasma discharge region. The ion beams and the heating current form a hot plasma that radiates photons or neutrons. The source of photons or neutrons may further include a second group of ion beam sources. The photons may be in the soft X-ray or extreme ultraviolet wavelength range and, in one embodiment, have wavelengths in a range of about 10–15 nanometers.

31 Claims, 16 Drawing Sheets

U.S. PATENT DOCUMENTS

| | | | |
|---|---|---|---|
| 4,841,556 A | * | 6/1989 | Kato et al. .................. 378/119 |
| 5,126,638 A | | 6/1992 | Dethlefsen |
| 5,315,629 A | | 5/1994 | Jewell et al. |
| 5,502,356 A | | 3/1996 | McGeoch |
| 5,504,795 A | | 4/1996 | McGeoch |
| 5,577,092 A | | 11/1996 | Kublak et al. |
| 6,075,838 A | | 6/2000 | McGeoch |
| 6,188,746 B1 | | 2/2001 | Miley et al. |
| 6,324,255 B1 | * | 11/2001 | Kondo et al. ................ 378/119 |
| 6,327,338 B1 | * | 12/2001 | Golovanivsky et al. ..... 378/119 |
| 6,504,903 B1 | * | 1/2003 | Kondo et al. ................ 378/119 |

* cited by examiner

STAR PINCH PLASMA SOURCE OF PHOTONS OR NEUTRONS

CROSS-REFERENCE TO RELATED APPLICATIONS

This application is a continuation-in-part of application Ser. No. 09/876,469 filed Jun. 7, 2001 now U.S. Pat. No. 6,567,499 and claims the benefit of provisional application Ser. No. 60/361,118 filed Mar. 1, 2002, which are hereby incorporated by reference in their entirety.

FIELD OF THE INVENTION

This invention relates to plasma sources and, more particularly, to sources of soft X-ray or extreme ultraviolet photons, or sources of neutrons, wherein high power production of photons or neutrons is achieved by electrostatic acceleration of ions toward a plasma discharge region, neutralization of the ions to avoid space charge repulsion as the discharge region is approached and the application of a heating current through the central plasma in order to raise its temperature and density.

BACKGROUND OF THE INVENTION

Soft X-ray and extreme ultraviolet photons can be generated in a hot plasma. The wavelength of the photons is determined by the mixture of ionization states present, with generally shorter wavelength photons being produced by the radiation of higher ionization states within the plasma. An example relevant to lithography is the xenon plasma that contains states $Xe^{10+}$, $Xe^{11+}$ and $Xe^{12+}$ and radiates strongly in the 10–15 nanometer (nm) band of the spectrum. Within this band, the 13.5 nanometer wavelength is considered to be the optimum for lithography because it can be reflected with up to 70% efficiency by molybdenum-silicon multilayer mirrors in a combination that re-images the pattern of a semiconductor circuit from a mask onto a silicon wafer.

Several approaches to the generation of these energetic photons have been researched in recent years. The plasma has been heated by laser pulses in the so-called laser-produced-plasma (LPP) method. Also, the plasma has been heated directly by the passage of a pulsed electric current in a variety of discharge-produced plasma (DPP) photon sources. These include the capillary discharge, the dense plasma focus and the Z-pinch. It is believed that a viable 13.5 nm source for commercial, high throughput lithography will be required to emit approximately 100 watts of photon power into 2 steradians in a 2% fractional band at 13.5 nm, from a roughly spherical source of diameter less than 1.5 millimeters. In xenon, which is the most efficient 13.5 nm radiator (of room temperature gaseous elements), the 2% fractional band is produced at an electrical efficiency of approximately 0.5% into $2\pi$ steradians in DPP sources and up to 1% into $2\pi$ steradians in LPP sources relative to laser power absorbed. For the lithography source, a plasma power of 30–60 kilowatts (kW) is therefore required. Other requirements are for precise plasma positioning, to provide uniform illumination, and a repetition frequency greater than 6 kHz.

In the prior art, the plasma has been positioned, in the case of a laser produced plasma, by the intersection of a stabilized beam of liquid xenon with a focused laser beam. The size and positional stability of the resulting plasma are compatible with the application, but with laser efficiencies of only 4% for the pulsed lasers of interest, an electrical input power of 750 kW to 1.5 megawatts is likely to be needed in order to generate 100 watts of 13.5 nm photons, making the economics of the LPP source very unfavorable.

By supplying electrical energy directly to the plasma, the DPP source can, in principle, have a power input not much greater than the 30–60 kW plasma power. However, in prior art discharges, the plasma has, with the exception of the dense plasma focus, been too large in at least one dimension, and the dense plasma focus itself depends on a closely positioned electrode, only a few millimeters distant from the plasma, to create a small, positionally stable plasma focus. There are limits to the plasma power that can be generated in such close proximity to a solid electrode, presenting a difficult scaling challenge for the dense plasma focus source.

Pending application Ser. No. 09/815,633 filed Mar. 23, 2001 discloses a new photon source, referred to herein as the astron source, wherein energy and material are fed into a plasma at a central location via numerous energetic neutral beams. In this source, a relatively large separation has been achieved between the plasma and the nearest solid surface. The astron source also has a distributed electrode which exhibits low current density and anticipated longer life. Although this approach has enabled the generation of a hot plasma that emits extreme ultraviolet photons and is capable in principle of being scaled to 30–60 kW plasma power, it depends on a high acceleration efficiency for the neutral beam particles. To date, only 20% efficiency has been measured, and improvements in acceleration efficiency are required in order to give this photon source a good electrical efficiency.

Accordingly, there is a need for improved methods and apparatus for generating soft X-ray or extreme ultraviolet photons.

SUMMARY OF THE INVENTION

According to a first aspect of the invention, a source of photons is provided. The source of photons comprises a housing that defines a discharge chamber, a first group of ion beam sources directed toward a plasma discharge region in the discharge chamber, the first group of ion beam sources comprising a first electrode and an inner shell that at least partially encloses the plasma discharge region, and a second electrode spaced from the plasma discharge region. The source of photons further comprises a first power supply for energizing the first group of ion beam sources to electrostatically accelerate, from the first group of ion beam sources toward the plasma discharge region, ion beams which are at least partially neutralized before they enter the plasma discharge region, and a second power supply coupled between the first and second electrodes for delivering a heating current to the plasma discharge region. The ion beams and the heating current form a hot plasma that radiates photons.

In some embodiments, the ion beams and the heating current are both pulsed, and the pulsed ion beams precede the pulsed heating current. The ion beams may be at least partially neutralized by resonant charge exchange.

The radiated photons may be in the soft X-ray or extreme ultraviolet wavelength range. In some embodiments, the ion beams comprise xenon ions and the radiated photons have wavelengths in a range of about 10–15 nanometers. The ion beams may comprise ions of a working gas selected from the group consisting of xenon, hydrogen, lithium, helium, nitrogen, oxygen, neon, argon and krypton.

In some embodiments, the first electrode comprises a first hollow ring electrode. The first power supply may be connected between the first hollow ring electrode and the inner shell. The second power supply may be connected between the first hollow ring electrode and the second electrode.

In some embodiments, the source of photons further comprises a second group of ion sources. The second group of ion sources may comprise a second hollow ring electrode and the inner shell. The first power supply may have a first terminal connected to the first and second hollow ring electrodes and a second terminal connected to the inner shell. The second power supply may be connected between the first and second hollow ring electrodes.

In some embodiments, the second electrode comprises a cup electrode. The cup electrode may be coupled to the plasma discharge region through a hole in the inner shell. In some embodiments, the source of photons may further comprise a ring electrode mounted within the cup electrode and a third power supply coupled between the ring electrode and the cup electrode.

In some embodiments, the inner shell may be divided into a first shell portion corresponding to the first hollow ring electrode and a second shell portion corresponding to the second hollow ring electrode. The first and second shell portions may be connected by a resistor having a value that is large in comparison with the impedance of the plasma during delivery of the heating current.

In some embodiments, the second electrode may comprise a structure defining an aperture for emission of a photon beam from the plasma discharge region.

According to a further aspect of the invention, a system for generating photons is provided. The system comprises a housing defining a discharge chamber, a first group of ion beam sources directed toward a plasma discharge region in the discharge chamber, the first group of ion beam sources comprising a first electrode and an inner shell that at least partially encloses the plasma discharge region, and a second electrode spaced from the plasma discharge region. The system further comprises a first power supply for energizing the first group of ion beam sources to accelerate, from the first group of ion beam sources toward the plasma discharge region, beams of ions of a working gas, wherein the ions are at least partially neutralized before they enter the plasma discharge region, a second power supply coupled between the first and second electrodes for delivering a heating current to the plasma discharge region, a gas source for supplying the working gas to the discharge chamber, and a vacuum system for controlling the pressure of the working gas in the discharge chamber.

According to another aspect of the invention, the apparatus described herein may be used for the production of neutrons.

BRIEF DESCRIPTION OF THE DRAWINGS

For a better understanding of the present invention, reference is made to the accompanying drawings, which are incorporated herein by reference and in which.

DETAILED DESCRIPTION

Figure 1A:
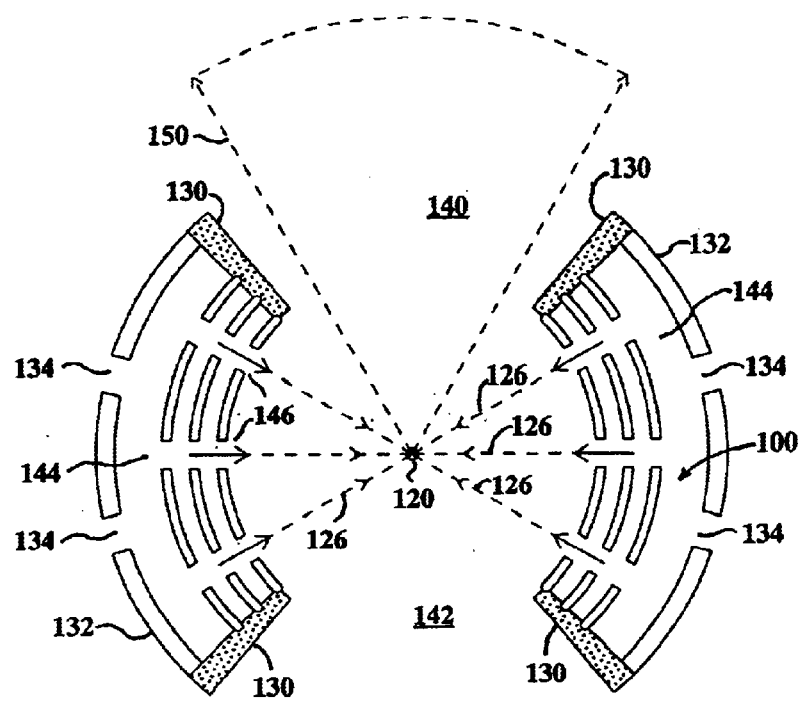
FIG. 1A is a cross-sectional side view of an embodiment of an extreme ultraviolet source based on the acceleration of multiple ion beams to a central plasma discharge region.

A star pinch photon source in accordance with a feature of the invention operates in two stages to produce X-ray or extreme ultraviolet radiation. In a first stage, a central plasma is formed using multiple ion beams directed at a central plasma discharge region as described below. In a second stage, a heating current pulse is passed through the central plasma in order to heat and compress the plasma, raising its temperature and density.

The astron source is a source of photons comprising a discharge chamber, a plurality of ion beam sources in the discharge chamber, each electrostatically accelerating a beam of ions of a working gas toward a plasma discharge region, and a neutralizing mechanism for at least partially neutralizing the ion beams before they enter the plasma discharge region. The neutralized beams enter the plasma discharge region and form a hot plasma that radiates photons.

The astron principle that operates in the first stage of the photon source described above is illustrated in FIGS. 1A and 1B. The embodiment of the source shown in FIGS. 1A and 1B has a two-gap ion acceleration structure 100. Acceleration structure 100 includes concentric spherical electrode shells 112, 113 and 114. The electrode shells 112, 113 and 114 have a plurality of sets of holes aligned along axes which pass through a central plasma discharge region 120. Thus, for example, holes 122, 123 and 124 in electrode shells 112, 113 and 114, respectively, are aligned along an axis 126 that passes through plasma discharge region 120. Each set of holes, such as holes 122, 123 and 124, defines an acceleration column 128. The spaces between electrode shells 112, 113 and 114 constitute acceleration gaps for electrostatic acceleration of ion beams. Thus, each acceleration column has two gaps in the embodiment of FIGS. 1A and 1B. The embodiment of FIGS. 1A and 1B includes 36 acceleration columns 128, arrayed in three sets of 12. Thus, the acceleration structure directs 36 ion beams toward plasma discharge region 120. However, different numbers of ion beams may be utilized within the scope of the invention.

The electrode shells 112, 113 and 114 may be supported by insulating spacers 130. A plenum 132 having ports 134 encloses acceleration structure 100.

Figure 1B:
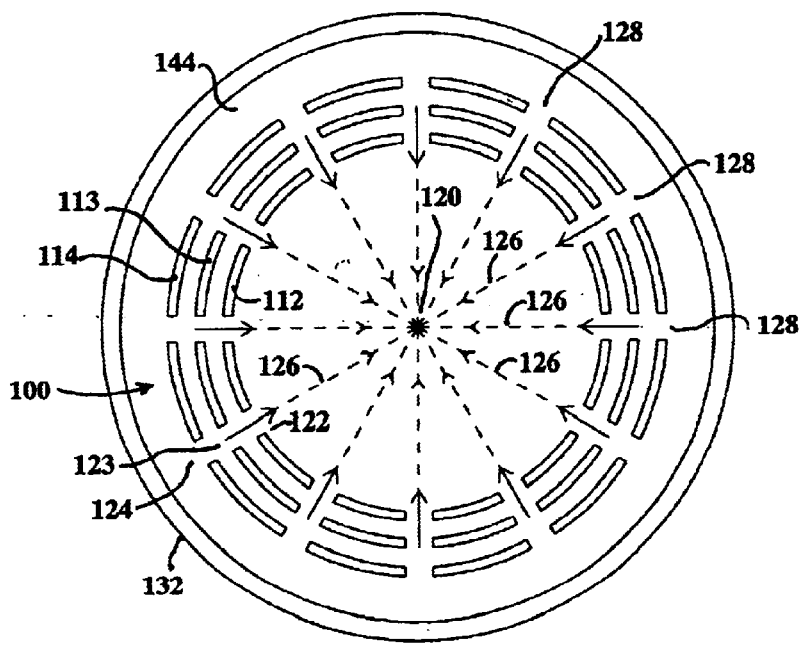
FIG. 1B is a cross-sectional top view of the extreme ultraviolet source shown in FIG. 1A.

A working gas is introduced, either in a pulsed mode or continuously, through ports 134 into a space 144 behind the outermost electrode shell 114. Some of the working gas flows down the acceleration columns 128. When the appropriate gas density is present in the acceleration columns, a pulsed voltage may be applied between electrode shells 112 and 114, with the polarity of electrode shell 114 being positive with respect to electrode shell 112. In the configuration of FIGS. 1A and 1B, provided the appropriate gas density is present and provided that sufficient voltage is applied, a pseudospark discharge develops simultaneously in each of the acceleration columns 128. The pseudospark discharge is characterized by the development of oppositely directed electron and ion beams that can have extremely high intensity. The ion beam exits from the negative polarity end of the acceleration column 128 at electrode shell 112 and progresses toward the central plasma discharge region 120.

By correct adjustment of the working gas density at an exit region 146 of each of acceleration columns 128, most of the ions can be neutralized by resonant charge exchange, so as to form a neutral beam that propagates without deflection to the plasma in plasma discharge region 120. Those ions that are not neutralized contribute excess positive charge to each of the ion beams, causing electrons to be attracted from the nearby surface of electrode shell 112, which is already primed as a cathode due to the breakdown into a pseudospark discharge. Thus, the neutral atoms are accompanied by a nearly charge-balanced beam plasma, including the remaining unneutralized ions and electrons. The slow ions resulting from resonant charge exchange define tracks that are favored for conduction of a high current heating pulse in the second stage of device operation, as described below. Additional details and embodiments of the astron photon source are described in the aforementioned application Ser. No. 09/815,633, which is hereby incorporated by reference.

Figure 2A:
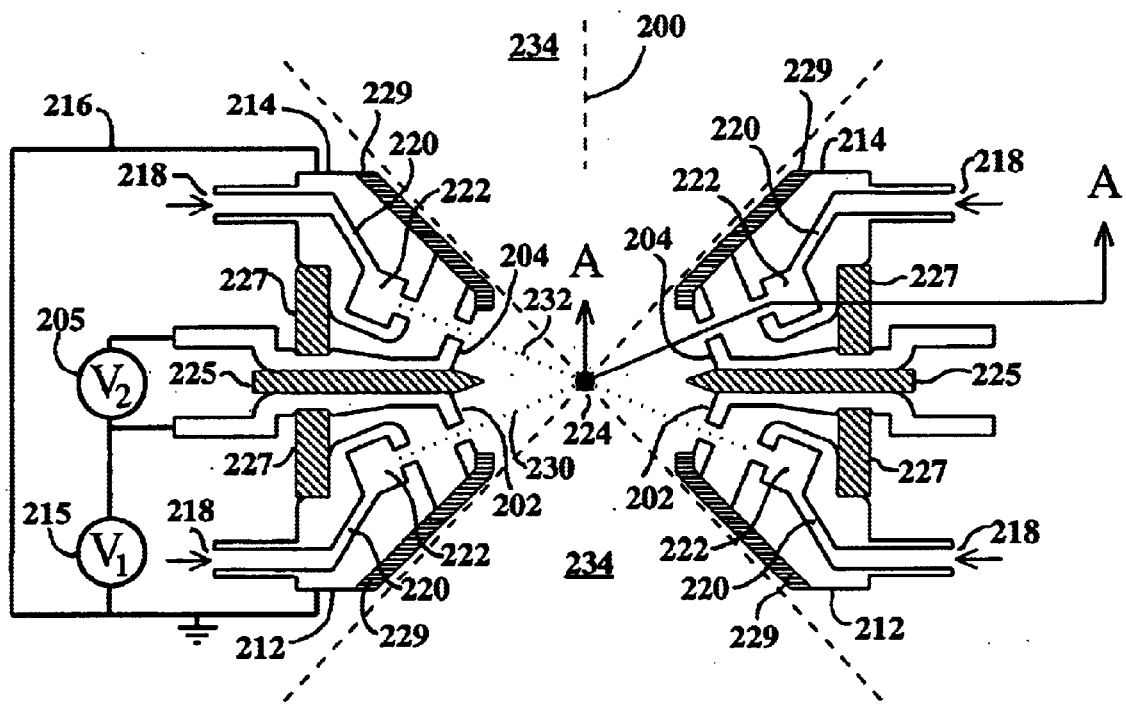
FIG. 2A is a cross-sectional side view of a first embodiment of a photon source in accordance with the invention.
Figure 2B:
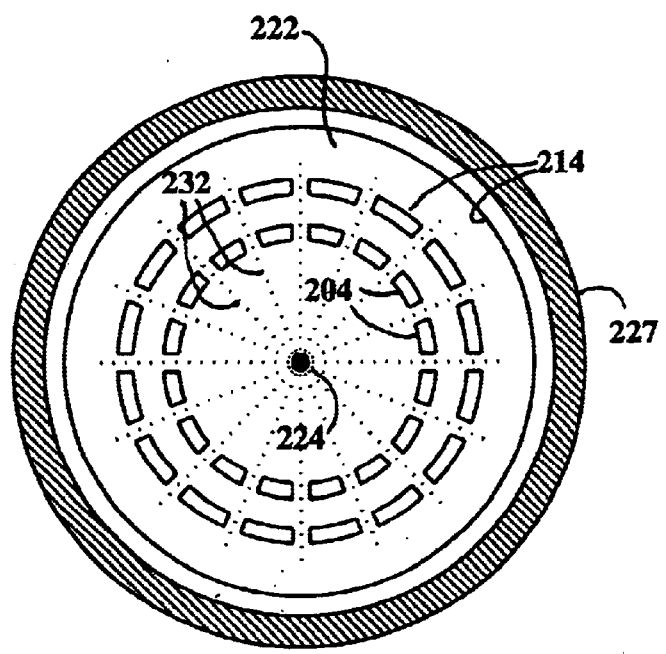
FIG. 2B is a cross-sectional top view of the photon source shown in FIG. 2A.

In the second stage of device operation, the newly-formed plasma is heated and compressed, or pinched, by passage through the plasma of a pulse of electric current. A first embodiment of a star pinch photon source which incorporates both the first stage of operation, wherein beams of ions are electrostatically accelerated toward a plasma discharge region and are at least partially neutralized, and the second stage, wherein an electric current is passed through the plasma discharge region, is shown in FIGS. 2A and 2B. FIG. 2A is a simplified cross-sectional side view of the photon source, and FIG. 2B is a cross-section defined by revolution of line A—A in FIG. 2A around axis 200. In FIGS. 2A and 2B, a central cathode shell, corresponding to electrode shell 112 in FIG. 1A, is divided into two half shells 202 and 204 that are electrically connected to a pulse voltage source 205. The anode shell of the photon source is divided into two half shells 212 and 214 which are electrically connected by a conductor 216. The working gas is introduced at low pressure through ports 218 and flows through passages 220 to enter hollow anode volumes 222 within anode half shells 212 and 214. Cathode half shells 202 and 204 are electrically isolated by insulator 225. The cathode half shells are electrically isolated from the respective anode half shells by insulators 227 and 229. A pulse voltage source 215 has one terminal connected to cathode half shells 202 and 204 (through the low impedance of voltage source 205) and the other terminal connected to anode half shells 212 and 214.

During the first phase of operation of the photon source shown in FIGS. 2A and 2B, a pulsed voltage $V_1$ from pulse voltage source 215 is applied between anode half shells 212, 214 and cathode half shells 202, 204. In the absence of any applied voltage $V_2$ from pulse source 205, the potential difference between cathode half shells 202 and 204 remains at zero. The combined cathode half shells are therefore pulsed negatively by voltage $V_1$ relative to the combined anode half shells, and a discharge develops as described above in connection with FIGS. 1A and 1B. Neutralized beams from this discharge pass through a plasma discharge region 224 to form a small spherical plasma. At the same time, the passage of ions and energetic neutral atoms forms ionized tracks 230 between cathode half shell 202 and plasma discharge region 224, and ionized tracks 232 between cathode half shell 204 and plasma discharge region 224. The ionized tracks 230 and 232 lie on the surfaces of two cones that have their vertices located at plasma discharge region 224 and provide conducting paths between cathode half shells 202 and 204.

During the second phase of operation, a pulsed voltage $V_2$ from pulse voltage source 205 is applied between cathode half shells 202 and 204. The circuit is completed by conduction through the conical configuration of ionized tracks connecting cathode half shells 202 and 204. Thus, cathode half shells 202 and 204 constitute first and second electrodes, respectively, for application of a heating current to the plasma in plasma discharge region 224. The current flows through the plasma in plasma discharge region 224, heating and compressing it via the magnetic pinch effect. The plasma temperature and density rise to the point where the desired X-ray or extreme ultraviolet radiation is emitted copiously. The radiation is emitted from the photon source in conical beams 234 that are relayed to the point of use by collecting optical surfaces (not shown in FIGS. 2A and 2B).

The working gas pressure in the central part of the acceleration structure may be maintained in a range of about 1.0 to 100 millitorr to provide the appropriate gas density. As noted above, one suitable working gas is xenon. Other suitable working gases include, but are not limited to, hydrogen, lithium, helium, nitrogen, oxygen, neon, argon and krypton.

The ion beams may be pulsed or continuous, and the ion acceleration voltage $V_1$ may be from 2 kV to 20 kV, but is not limited to this range. Voltage $V_1$ may have a typical pulse duration of 0.1 to 10 microseconds, but may also be applied continuously. The heating voltage $V_2$ is applied typically within 100 nanoseconds to 10 microseconds of the initial application of voltage $V_1$. The amplitude of voltage $V_2$ is typically in the range of 100 volts to 10 kV, and the width of this pulse typically ranges from 10 nanoseconds to 1 microsecond.

Figure 3:
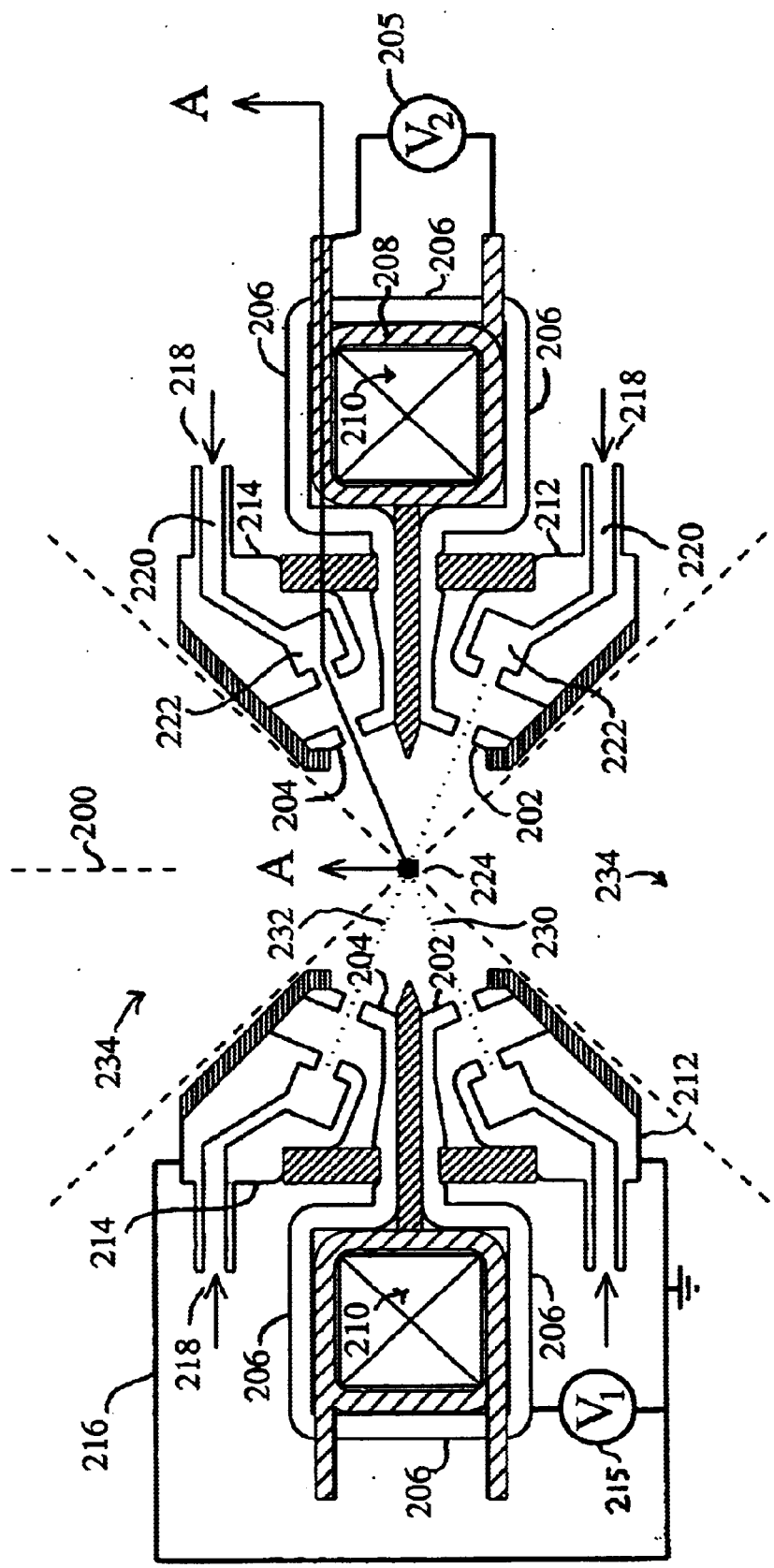
FIG. 3 is a cross-sectional side view of a second embodiment of a photon source in accordance with the invention.
Figure 4:
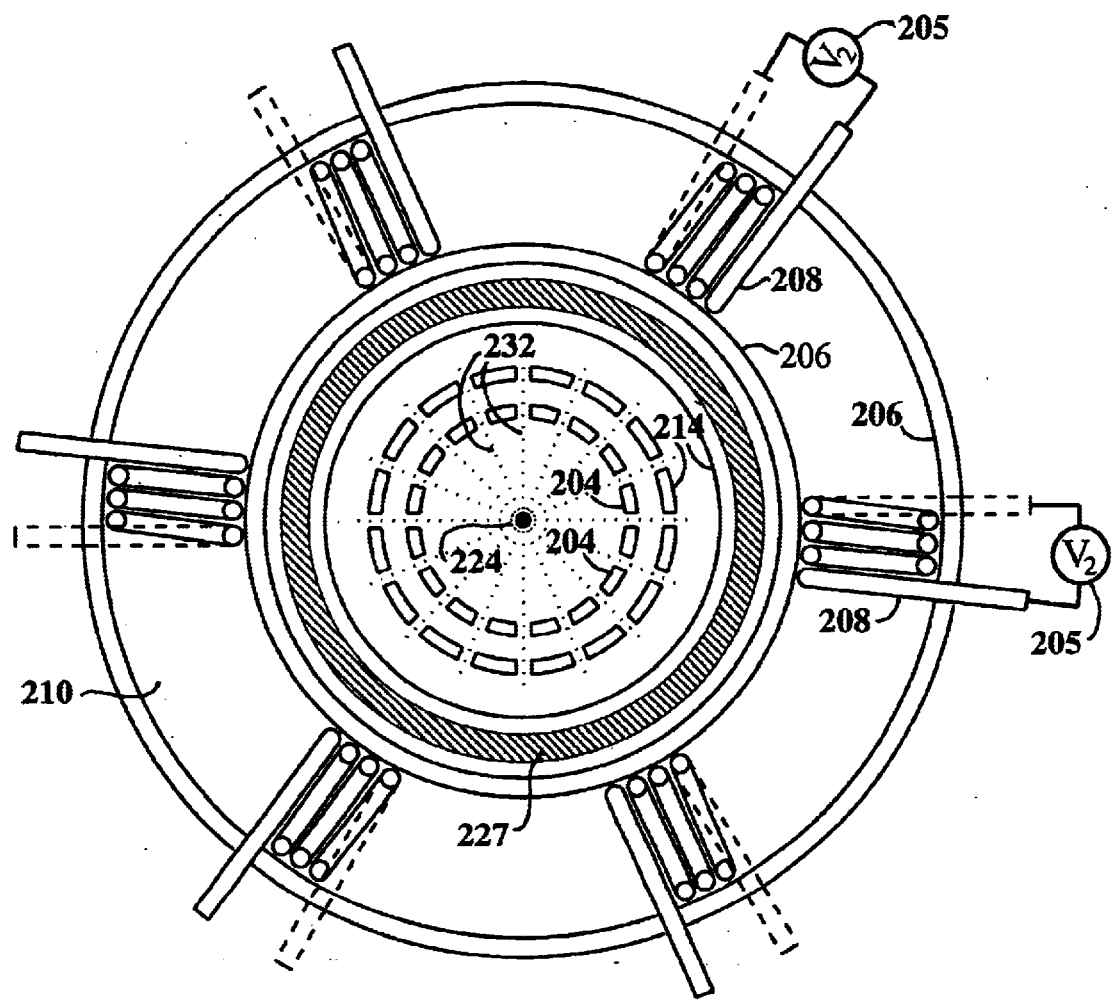
FIG. 4 is a cross-sectional top view of the photon source shown in FIG. 3.

A second embodiment of a photon source in accordance with the invention is shown in FIGS. 3 and 4. FIG. 3 is a simplified cross-sectional side view of the photon source, and FIG. 4 is a cross-section defined by revolution of line A—A in FIG. 3 around axis 200. Like elements in FIGS. 2A, 2B, 3 and 4 have the same reference numerals. The embodiment of FIGS. 3 and 4 differs from the embodiment of FIGS. 2A and 2B by the addition of a transformer 211 for coupling pulsed electrical current from pulse voltage source 205 to cathode half shells 202 and 204. Transformer 211 includes multiple primary windings 208, a toroidal core 210, which may be of non-magnetic or magnetic material, and an armature or secondary 206, also having a toroidal configuration. Primary windings 208 are connected to pulse voltage source 205, and secondary 206, which may have a single turn, is connected between cathode half shells 202 and 204.

During the first phase of operation, a pulsed voltage $V_1$ is applied by pulse source 215 between the anode half shells 212, 214 and secondary winding 206 that is connected to cathode half shells 202 and 204. In the absence of any applied voltage $V_2$ from pulse voltage source 205 to primary windings 208, the electric potential between the cathode half shells 202 and 204 remains at zero. The combined cathode half shells are therefore pulsed negatively by voltage $V_1I$ relative to the combined anode half shells 212 and 214, and a discharge develops as described above. The neutralized beams of this discharge pass through plasma discharge region 224 to form a small spherical plasma. At the same time, the passage of ions and energetic neutral atoms forms ionized tracks 230 and 232 as described above.

During the second phase of operation, a pulsed voltage $V_2$ is applied simultaneously and in parallel across all the primary windings 208, with the result that a voltage is induced between cathode half shells 202 and 204 that are connected to opposite ends of transformer secondary 206. The transformer secondary circuit is completed by a conduction through the ionized tracks 230 and 232 connecting cathode half shells 202 and 204. As in the embodiment of FIGS. 2A and 2B, cathode half shells 202 and 204 constitute first and second electrodes, respectively, for application of a heating current to the plasma in plasma discharge region 224. The secondary current flows through the plasma in plasma discharge region 224, heating and compressing it via the magnetic pinch effect. As described above, the plasma temperature and density rise to the point where the desired X-ray or extreme ultraviolet radiation is emitted.

Figure 5:
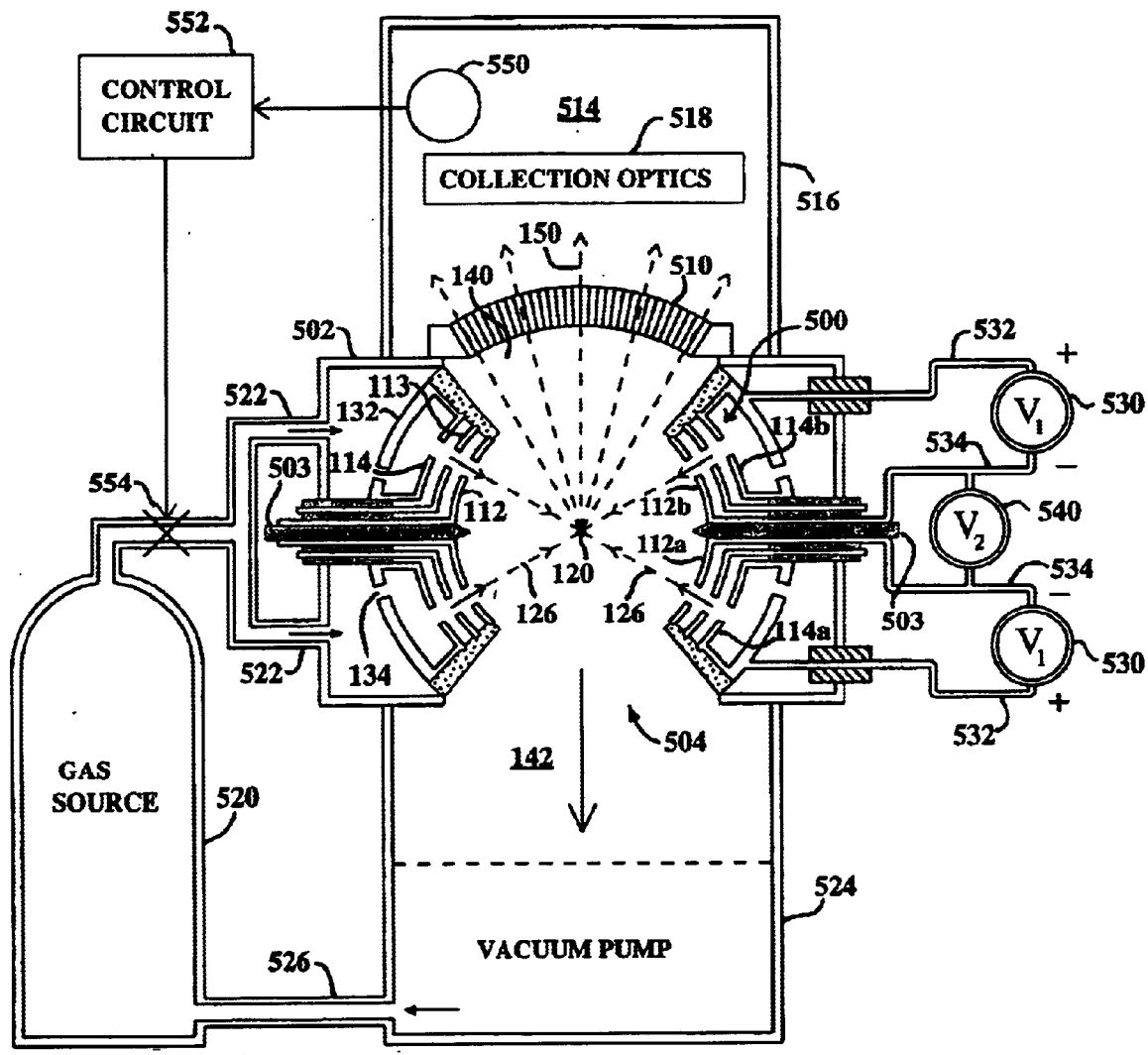
FIG. 5 is a schematic representation of an embodiment of a system for generating photons in accordance with the invention.

An embodiment of a system for generating photons in accordance with the invention is shown schematically in FIG. 5. An acceleration structure 500 may correspond to the acceleration structure shown in FIGS. 2A and 2B, the acceleration structure shown in FIGS. 3 and 4, or any other acceleration structure within the scope of the present invention. In the system of FIG. 5, acceleration structure 500 is a modification of acceleration structure 100 shown in FIGS. 1A and 1B and described above. Like elements in FIGS. 1A, 1B and 5 have the same reference numerals.

Acceleration structure 500 includes concentric spherical electrode shells 112, 113 and 114, each of which is divided by an insulator 503 into electrode half shells. A pulse voltage source 540 is connected between inner electrode half shells 112a and 112b. A pulse voltage source 530 is connected between outer electrode half shells 114a, 114b and inner electrode half shells 112a, 112b.

Acceleration structure 500 is enclosed within a housing 502 that defines a discharge chamber 504. A top aperture 140 of acceleration structure 500 is coupled through a screen 510 to a collection region 514 that is defined by an enclosure 516. Enclosure 516 contains collection optics 518 for relaying a photon beam 150 to a remote point of use. Screen 510 constitutes a beam exit aperture which allows propagation of photons from discharge chamber 504 to collection region 514 but impedes flow of gas from discharge chamber 504 to collection region 514.

A gas source 520 coupled to housing 502 supplies a working gas through inlets 522 and ports 134 in plenum 132 to acceleration structure 500. A bottom aperture 142 of acceleration structure 500 is coupled to a vacuum pump 524. An outlet 526 of vacuum pump 524 is connected to gas source 520 to form a gas recirculation system. The gas source 520 and the vacuum pump 524 are connected to housing 502 in a closed loop configuration that permits recirculation of the working gas through discharge chamber 504. Gas source 520 may include elements for removing impurities and particulates from the working gas. The system may include a detector 550 located in collection region 514, a control circuit 552 and a flow controller 554 for a feedback control of the rate of flow of the working gas into the discharge chamber 504 in response to a measured spectrum of the radiated photons.

In another embodiment of the vacuum pumping system (not shown), the vacuum pump is connected to enclosure 516 rather than to housing 502. In this embodiment, gas is pumped from the central part of acceleration structure 500 through screen 510 or other beam exit aperture and then through enclosure 516.

The system of FIG. 5 operates with first and second phases as described above in connection with FIGS. 2A and 2B. In the first phase, pulse source 530 applies a pulsed voltage between inner electrode half shells 112a, 112b and outer electrode half shells 114a, 114b, causing neutralized beams to be directed toward plasma discharge region 120. In the second stage, the plasma in discharge region 120 is heated and compressed by passage of a pulse of electric current. The neutralized beams form ionized tracks between cathode half shells 112a, 112b and plasma discharge region 120. Application of a pulse to cathode half shells 112a and 112b by pulse source 540 causes electrical current to flow along the ionized tracks through plasma discharge region 120. Thus, cathode half shells 112a and 112b constitute first and second electrodes, respectively, for application of a heating current to the plasma in plasma discharge region 120. The current flows through the plasma in plasma discharge region 120, heating and compressing it. The plasma temperature and density rise to the point where the desired X-ray or extreme ultraviolet radiation is emitted. The radiation is emitted from the acceleration structure 500 as conical photon beam 150.

Figure 6A:
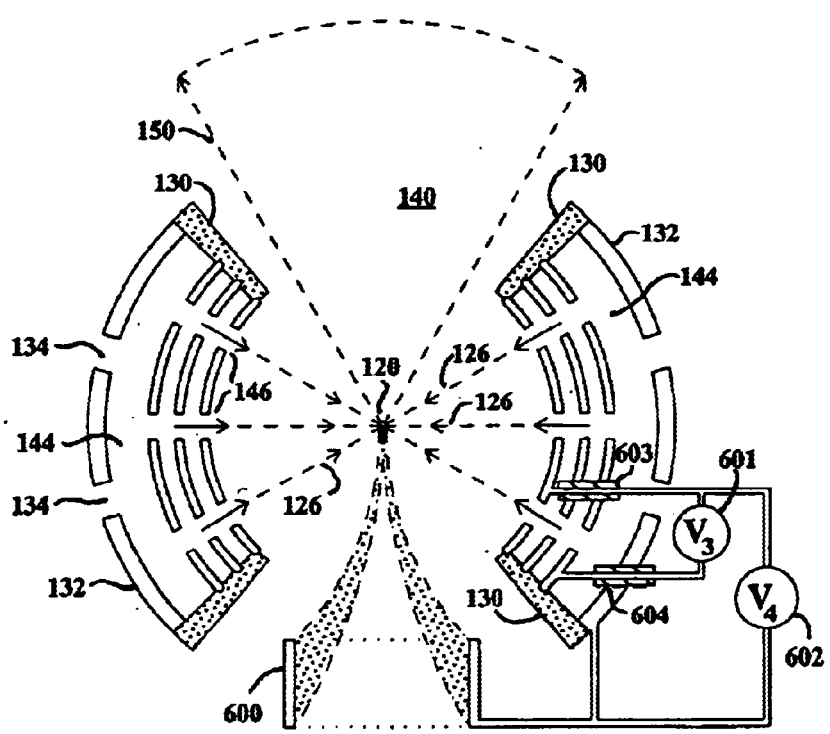
FIG. 6A is a cross-sectional side view of a third embodiment of a photon source in accordance with the invention.
Figure 6B:
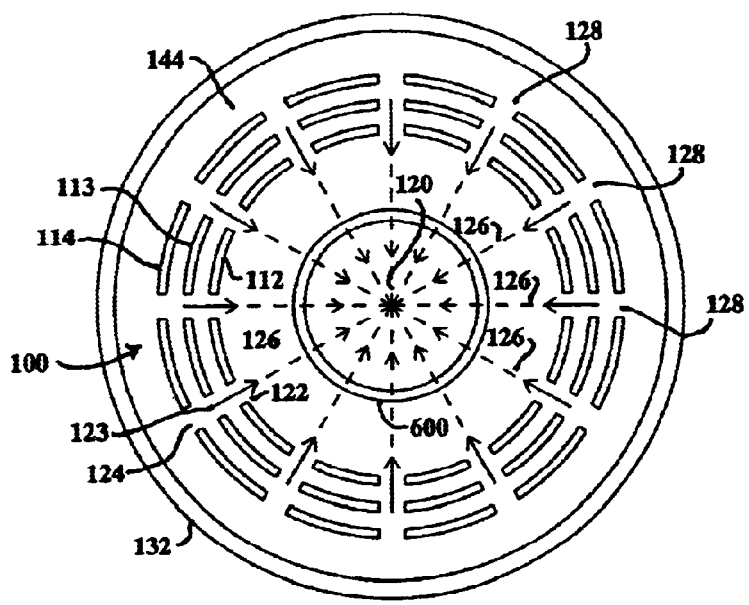
FIG. 6B is a cross-sectional top view of the photon source shown in FIG. 6A.

A third embodiment of a photon source in accordance with the invention is shown in FIGS. 6A and 6B. Like elements in FIGS. 1A, 1B, 6A and 6B have the same reference numerals. The embodiment of FIGS. 6A and 6B differs from the structure of FIGS. 1A and 1B by the addition of an external electrode 600 for supplying an electrical heating current to plasma discharge region 120. A pulse voltage source 601 is connected between inner electrode shell 112 and outer electrode shell 114. A pulse voltage source 602 is connected between inner electrode shell 112 and external electrode 600. Insulators 603 and 604 electrically isolate the connections to electrode shells 112 and 114, respectively. External electrode 600 may have a cylindrical configuration and may be positioned in the bottom aperture of the acceleration structure in spaced relationship to plasma discharge region 120.

During the first phase of operation, a pulse voltage $V_3$ from voltage source 601 is applied between electrode shells 112 and 114. A discharge develops as described above, and the neutralized beams of the discharge pass through plasma discharge region 120 to form a plasma. At the same time, the passage of ions and energetic neutral atoms forms ionized tracks as described above.

During the second phase of operation, a pulse voltage $V_4$ from voltage source 602 is applied between external electrode 600 and electrode shell 112. The circuit is completed by conduction through the ionized tracks connecting electrode shell 112 and plasma discharge region 120 and through a glow region 605 between plasma discharge region 120 and external electrode 600. Thus, inner electrode shell 112 constitutes a first electrode and external electrode 600 constitutes a second electrode for application of a heating current to the plasma in plasma discharge region 120. The current flows through the plasma in plasma discharge region 120, heating and compressing it. The plasma temperature and density rise to the point where the desired X-ray or extreme ultraviolet radiation is emitted. The plasma tends to be elongated in the direction of external electrode 600. The working gas extends to electrode 600 at approximately the same pressure as inside electrode shell 112.

Figure 7:
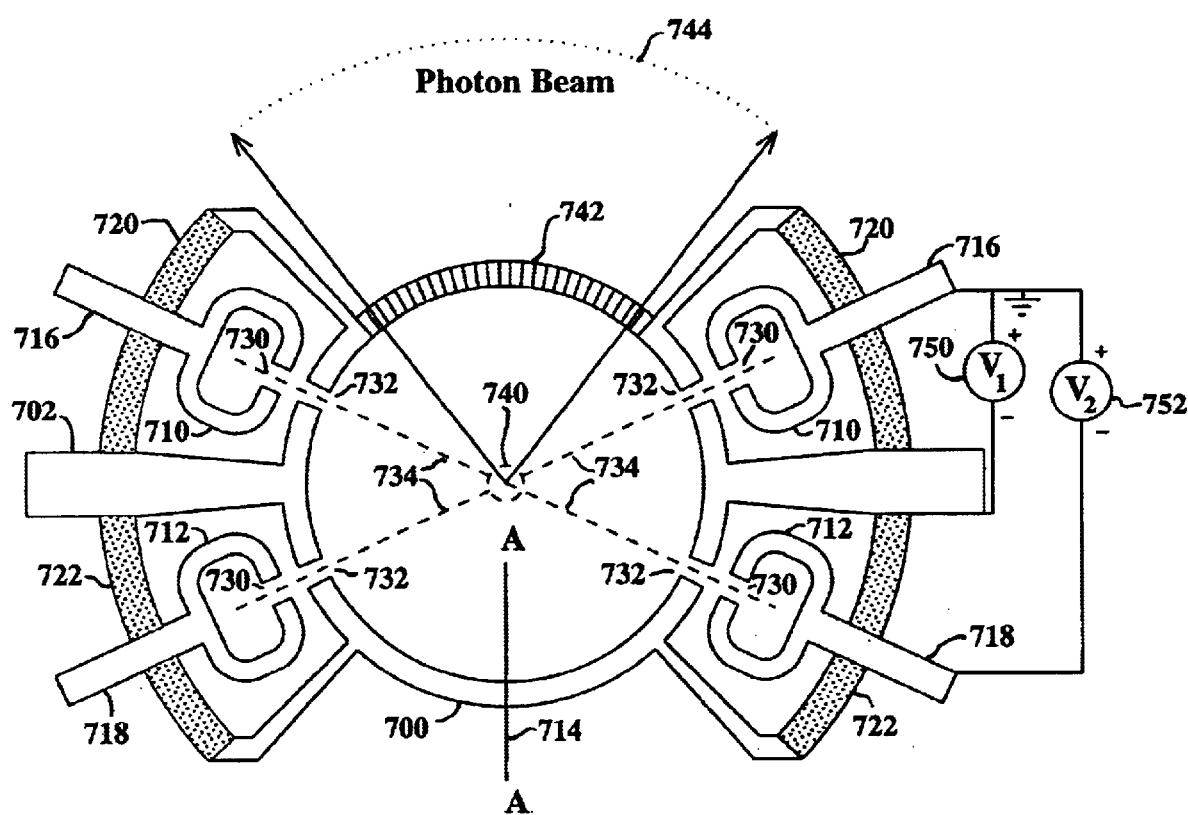
FIG. 7 is a cross-sectional side view of a fourth embodiment of a photon source in accordance with the invention.

A fourth embodiment of a photon source in accordance with the invention is shown in FIG. 7. FIG. 7 is a simplified cross-sectional side view of the photon source. A chamber, or inner shell 700, which may be spherical, has an electrically conducting wall and a hollow interior. Inner shell 700 may include an annular flange 702 for electrical connection and mechanical support. The photon source further includes ring electrodes 710 and 712 disposed around a source axis 714 outside inner shell 700. Ring electrodes 710 and 712 may include flanges 716 and 718, respectively, for electrical connection and mechanical support. Ring electrodes 710 and 712 are supported by insulators 720 and 722, respectively. Each of ring electrodes 710 and 712 may comprise a hollow ring or toroid. Each of ring electrode 710 and ring electrode 712 has a plurality of holes 730, and inner shell 700 has a hole 732 corresponding to each hole 730 to form hole pairs 730, 732. The holes 730 and 732 of each hole pair are aligned and define a plasma channel 734 that intersects a central plasma discharge region 740. In one embodiment, each of ring electrodes 710 and 712 has 24 holes 730 spaced around axis 714. The spaces between each of ring electrodes 710 and 712 and inner shell 700 constitute acceleration gaps for electrostatic acceleration of ion beams. Each hole pair 730, 732 defines an ion beam source, thus providing 48 ion beam sources having plasma channels 734 intersecting plasma discharge region 740.

The photon source shown in FIG. 7 may be mounted in a housing, as described above in connection with FIG. 5. The housing is filled with a working gas, for example xenon for 10–15 nanometer extreme ultraviolet emission, at low pressure, typically 1–100 millitorr. Inner shell 700 may be provided with a beam exit aperture, such as a honeycomb structure 742 comprising multiple, aligned, small bore holes having high optical transmission for a photon beam and low conductance for the working gas in order to provide near vacuum conditions for photon propagation. The honeycomb structure 742 may correspond to the screen 510 shown in FIG. 5 and described above. A photon beam 744 of extreme ultraviolet or soft X-ray radiation is emitted from inner shell 700 through honeycomb structure 742.

A power supply 750 is connected between ring electrode 710 and inner shell 700, and a power supply 752 is connected between ring electrode 710 and ring electrode 712. Each of power supplies 750 and 752 is capable of providing high voltage pulses having pulse widths of 0.1–10 microseconds.

In a first phase of operation, power supply 750 applies a negative DC potential to inner shell 700 relative to ring electrodes 710 and 712. Ring electrodes 710 and 712 remain at the same electrical potential during this phase of operation, connected through low impedance power supply 752. Power supply 750 supplies a DC current, typically 1–100 milliamps, to maintain a discharge in all hole pairs 730, 732. The plasma channels 734 defined by hole pairs 730, 732 intersect at plasma discharge region 740. Power supply 750 is then pulsed, typically a 1–10 microsecond pulse, to a negative voltage, typically 1–20 kV, and drives an increased current, typically 1–100 amps, through the plasma channels 734. Ions of the working gas are accelerated toward plasma discharge region 740. During passage along plasma channels 734, the ions experience neutralizing collisions in a resonant charge exchange process, so that the ion beams are at least partially neutralized before they enter plasma discharge region 740 to form a dense plasma.

During a second phase of operation, power supply 752 applies a high current pulse, typically 0.1–10 microseconds and 1–100 kiloamps, to ring electrodes 710 and 712. The pulse from power supply 752 may be initiated during the pulse from power supply 750 or at most slightly after the end of the pulse from power supply 750. Thus, power supply 752 is typically triggered about 0.1–10 microseconds after power supply 750 is triggered. The circuit is completed through plasma channels 734. In particular, ring electrode 710 defines an upper conical array of plasma channels 734, and ring electrode 712 defines a lower conical array of plasma channels 734. In this embodiment, ring electrode 710 constitutes a first electrode and ring electrode 712 constitutes a second electrode for application of a heating current to the plasma in plasma discharge region 740. The high current from power supply 752 compresses and heats the plasma in plasma discharge region 740 so that it emits extreme ultraviolet or soft X-ray photons which propagate from inner shell 700 through honeycomb structure 742 as photon beam 744 to be used in an application.

Figure 8:
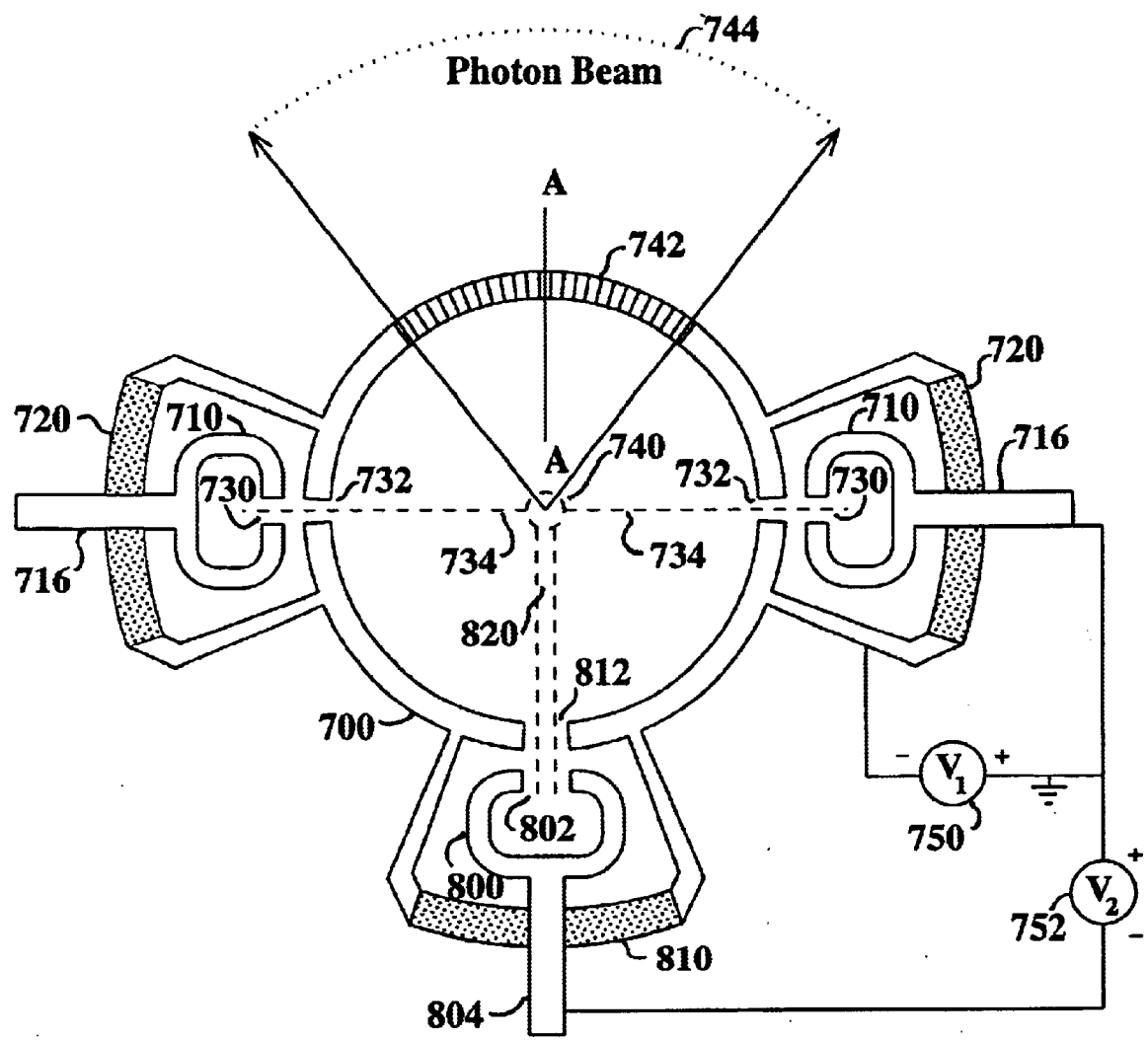
FIG. 8 is a cross-sectional side view of a fifth embodiment of a photon source in accordance with the invention.

A fifth embodiment of a photon source in accordance with the invention is shown in FIG. 8. FIG. 8 is a simplified cross-sectional side view of the photon source. Like elements in FIGS. 7 and 8 have the same reference numerals. In the embodiment of FIG. 8, an electrode 800 replaces ring electrode 712 used in the embodiment of FIG. 7. Electrode 800 may be cup-shaped and may have a single hole 802 and a rod 804 for electrical connection and mechanical support. Cup electrode 800 functions as a hollow electrode and is supported by an insulator 810. A hole 812 in inner shell 700 is aligned with hole 802 in cup electrode 800 to define a plasma channel 820. Power supply 750 is connected between ring electrode 710 and inner shell 700, and power supply 752 is connected between ring electrode 710 and cup electrode 800.

In a first phase of operation, power supply 750 applies a negative DC potential to inner shell 700 relative to electrodes 710 and 800. Electrode 800 and ring electrode 710 remain at the same potential during this phase of operation, connected through low impedance power supply 752. Power supply 750 supplies a DC current, typically 1–100 milliamps, to maintain a discharge in all hole pairs 730, 732. Plasma channels 734 intersect at plasma discharge region 740. Power supply 750 is pulsed, typically 1–10 microseconds, to a negative voltage, typically 1–20 kV, and drives an increased current, typically 1–100 amps, through hole pairs 730, 732 and 802, 812. Ions of the working gas are accelerated toward plasma discharge region 740. In passage along plasma channel 734, the ions experience neutralizing collisions in a resonant charge exchange process, so that the ion beams are at least partially neutralized before they enter plasma discharge region 740 to form a dense plasma.

During a second phase of operation, power supply 752 applies a high current pulse, typically 0.1–10 microseconds and 1–100 kiloamps, to electrodes 710 and 800. The circuit is completed through plasma channels 734 and 820. In this embodiment, ring electrode 710 constitutes a first electrode and electrode 800 constitutes a second electrode for application of a heating current to the plasma in plasma discharge region 740. This high current compresses and heats the plasma in plasma discharge region 740 so that it emits extreme ultraviolet or soft X-ray photons which propagate from inner shell 700 through honeycomb structure 742 as photon beam 744 to be used in an application.

Figure 9:
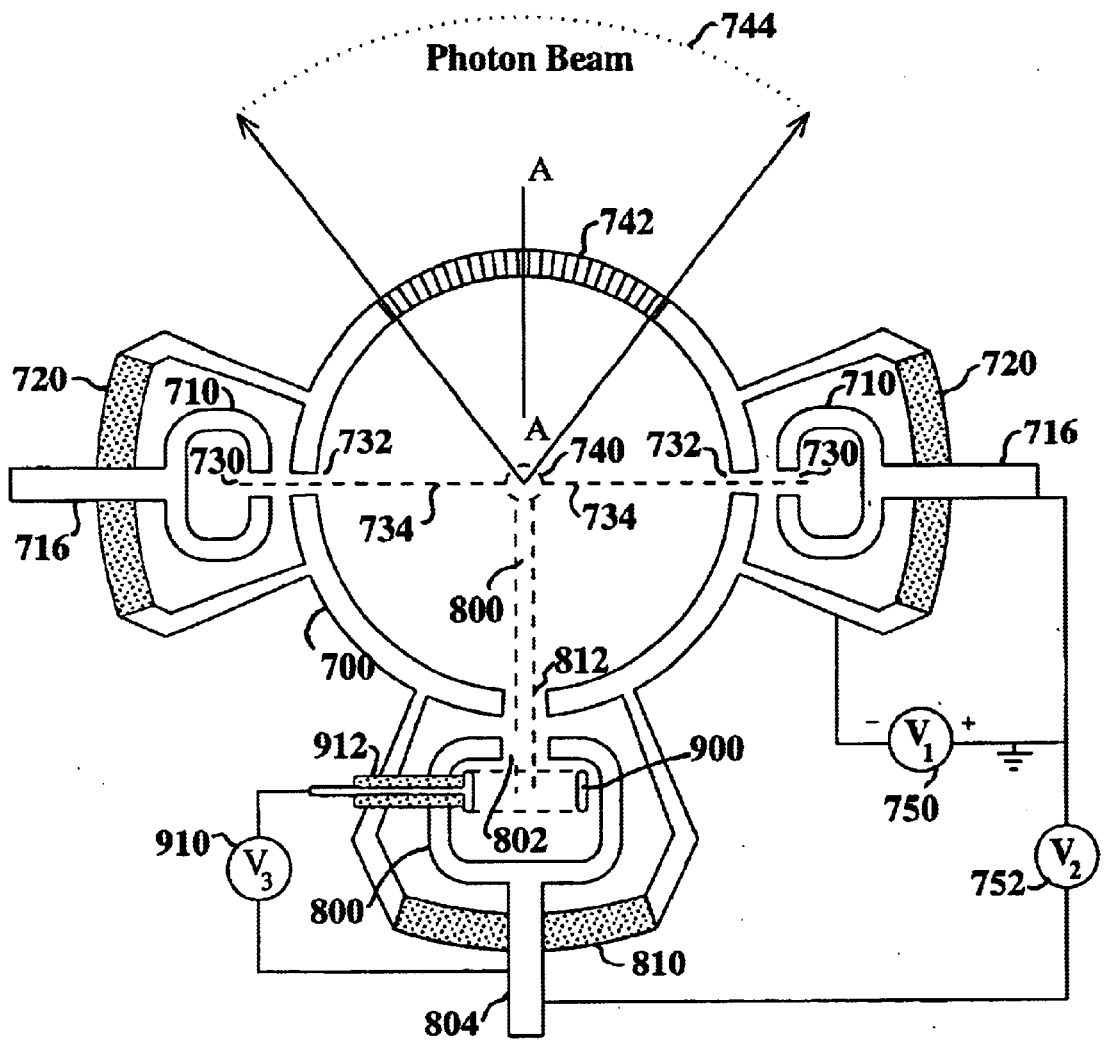
FIG. 9 is a cross-sectional side view of a sixth embodiment of a photon source in accordance with the invention.

A sixth embodiment of a photon source in accordance with the invention is shown in FIG. 9. FIG. 9 is a simplified cross-sectional side view of the photon source. Like elements in FIGS. 7–9 have the same reference numerals. The embodiment of FIG. 9 differs from the embodiment of FIG. 8 by the addition of a ring electrode 900 within cup electrode 800 and a power supply 910 connected between ring electrode 900 and cup electrode 800. The connection to ring electrode 900 is electrically isolated from chamber 700 and cup electrode 800 by an insulator 912.

The DC discharge between cup electrode 800 and inner shell 700 can be modulated to have greater or lesser current by the application of a voltage from power supply 910 between ring electrode 900 and cup electrode 800. When ring electrode 900 is positive with respect to cup electrode 800, electrons are removed from the discharge and the cup electrode current is decreased or inhibited completely. When ring electrode 900 is made negative with respect to cup electrode 800, the discharge is enhanced. In this way, the discharge from the cup electrode 800 may be balanced with the combined discharges from ring electrode 710 to inner shell 700 in spite of their different geometries. This configuration facilitates rapid electrical breakdown between external electrode 800 and ring electrode 710 during the high current phase when power supply 752 is energized. A rapid negative pulse to ring electrode 900 can assist in the initiation of the high current discharge when power supply 752 is energized. Operation of the sixth embodiment is otherwise similar to the operation of the fifth embodiment described above.

Any of the DC discharges can be controlled using electrodes, similar to ring electrode 900, within the anode enclosures adjacent to holes 730. This may apply, for example, in FIG. 7 to balance the DC discharges from ring electrode 710 to inner shell 700 with respect to the DC discharges from ring electrode 712 to inner shell 700.

Figure 10A:
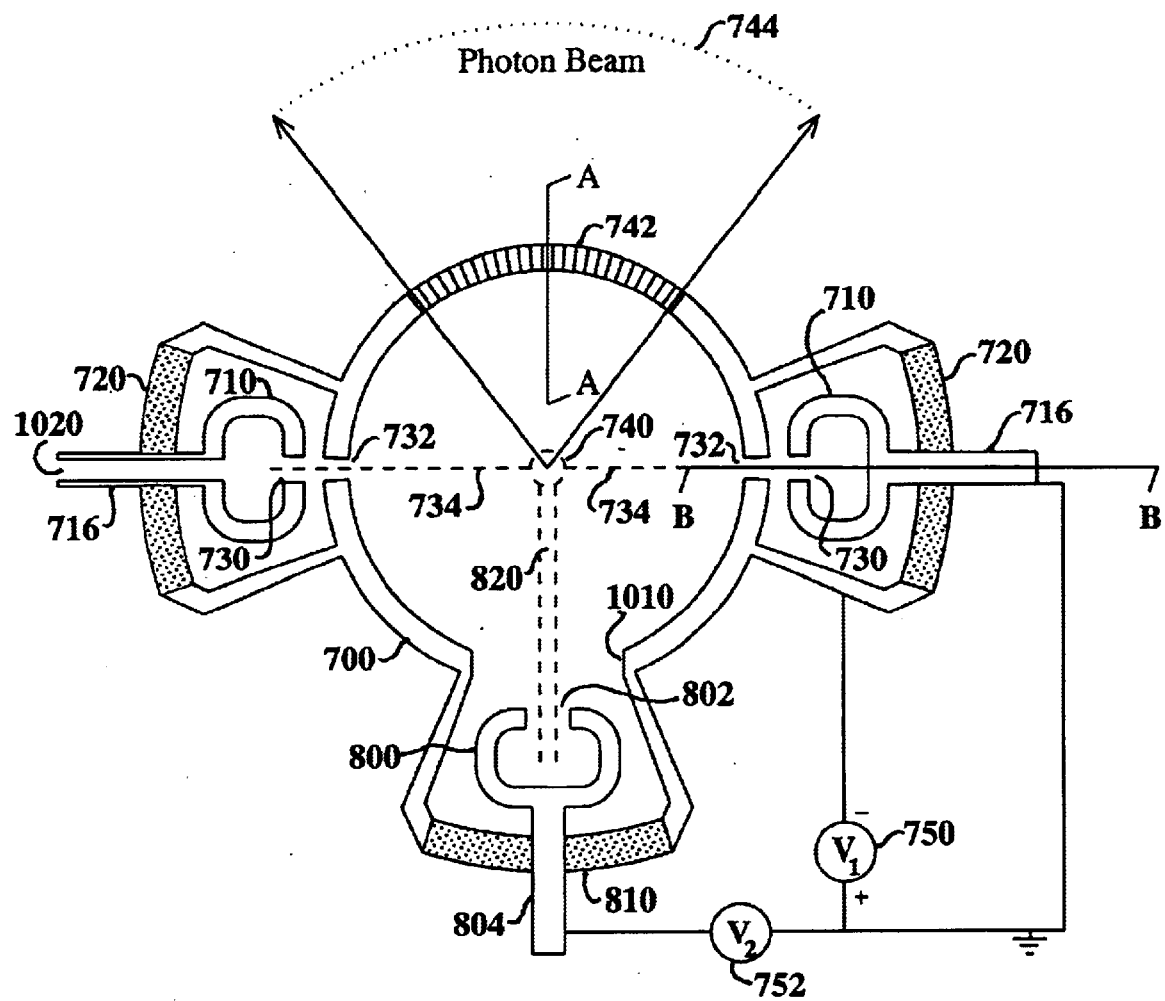
FIG. 10A is a cross-sectional side view of a seventh embodiment of a photon source in accordance with the invention.
Figure 10B:
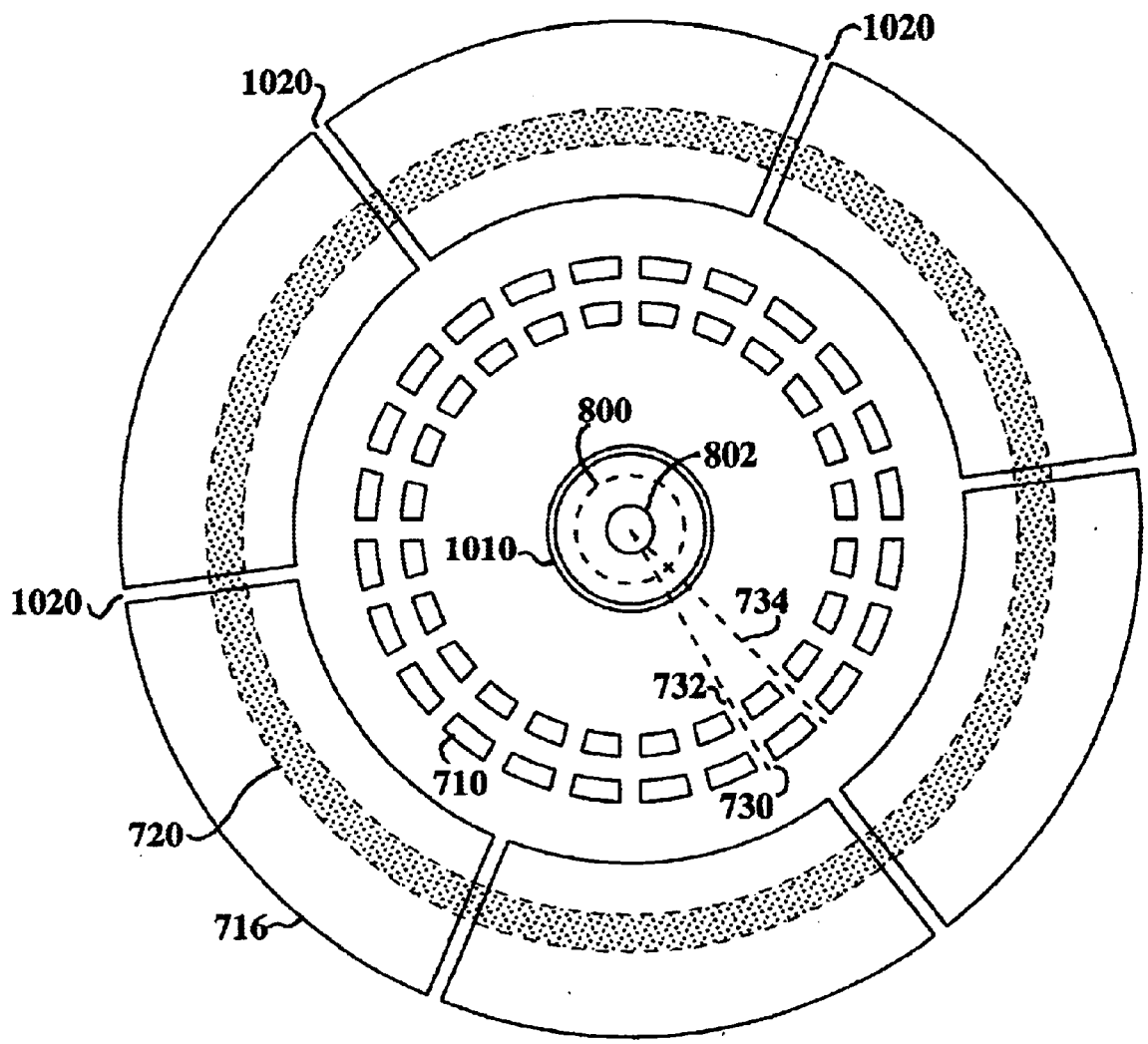
FIG. 10B is a cross-sectional top view of the photon source shown in FIG. 10A.

A seventh embodiment of a photon source in accordance with the invention is shown in FIGS. 10A and 10B. FIG. 10A is a simplified cross-sectional side view of the photon source, and FIG. 10B is a cross-sectional top view of the photon source shown in FIG. 10A. Like elements in FIGS. 7–10B have the same reference numerals. The embodiment of FIGS. 10A and 10B differs from the embodiment of FIG. 8 with respect to the coupling between cup electrode 800 and inner shell 700. Referring again to FIG. 8, cup electrode 800 is coupled to inner shell 700 through a relatively small diameter hole 812. In the embodiment of FIGS. 10A and 10B, inner shell 700 has a relatively large diameter opening 1010 to cup electrode 800. Opening 1010 may be in a range of about 40% to 100% of the diameter of inner shell 700. Operation of the seventh embodiment is otherwise similar to the operation of the fifth embodiment described above.

As noted above, the working gas is ionized within hollow ring electrode 710. In a preferred embodiment, the working gas is supplied to the interior of ring electrode 710 through a plurality of conduits 1020 in flange 716 to ensure relatively uniform distribution of the working gas within ring electrode 710. It will be understood that similar conduits may be utilized in ring electrode 712 of FIG. 7 and in the cup electrode 800 of FIGS. 8, 9 and 10A and 10B. It will be further understood that different configurations may be utilized for supplying the working gas to the interior regions of the ion beam sources within the scope of the present invention.

Figure 11A:
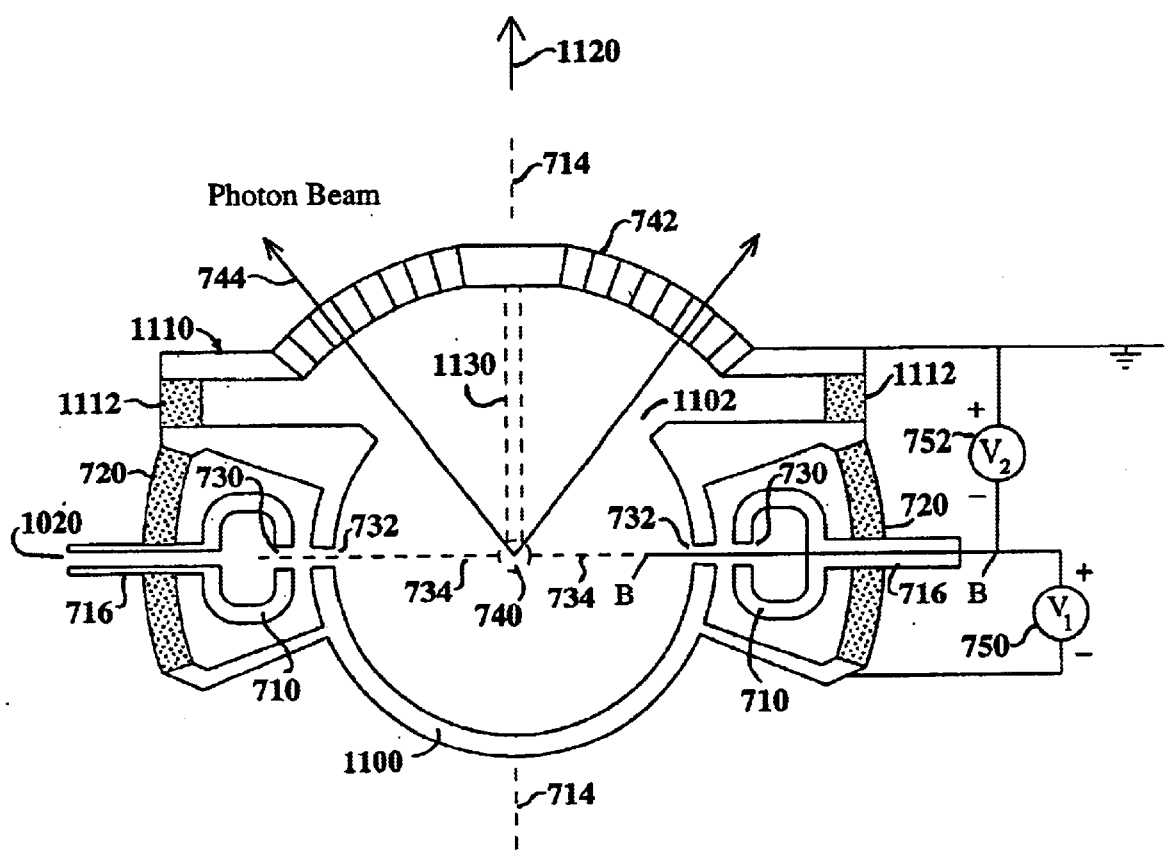
FIG. 11A is a cross-sectional side view of an eighth embodiment of a photon source in accordance with the invention.
Figure 11B:
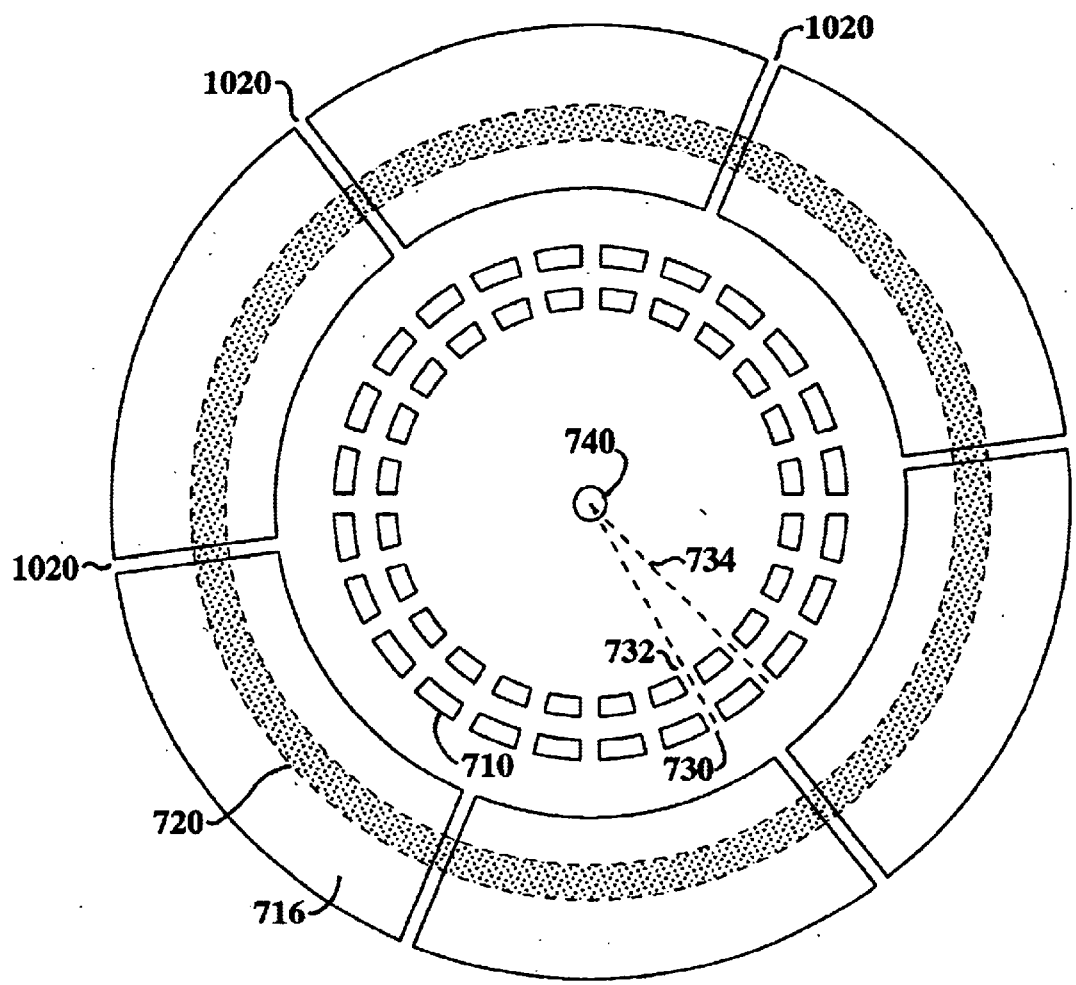
FIG. 11B is a cross-sectional top view of the photon source shown in FIG. 11A.

An eighth embodiment of a photon source in accordance with the invention is shown in FIGS. 11A and 11B. FIG. 11A is a simplified cross-sectional side view of the photon source, and FIG. 11B is a cross-sectional top view of the photon source shown in FIG. 11A. Like elements in FIGS. 7–11B have the same reference numerals. The embodiment of FIGS. 11A and 11B differs from the embodiment of FIG. 8 with respect to the configuration of the second electrode and the inner shell.

In the embodiment of FIGS. 11A and 11B, an inner shell 1100 may be generally spherical in shape and has an opening 1102 for emission of photon beam 744. Hollow ring electrode 710 has an annular configuration and is located outside inner shell 1100 in a plane perpendicular to source axis 714. A second electrode 1110 having honeycomb structure 742 or other beam exit aperture is positioned over opening 1102 in inner shell 1100. Second electrode 1110 is electrically isolated from inner shell 1100 by an insulator 1112. First power supply 750 is connected between inner shell 1100 and ring electrode 710, and second power supply 752 is connected between ring electrode 710 and second electrode 1110. Photon beam 744 is emitted in a beam direction 1120 along source axis 714.

In a first phase of operation, power supply 750 applies a negative DC potential to inner shell 1100 relative to ring electrode 710. Power supply 750 supplies a DC current, typically 1–100 milliamps, to maintain a discharge in all hole pairs 730, 732. The plasma channels 734 defined by hole pairs 730, 732 intersect at plasma discharge region 740. Power supply 750 is then pulsed, typically a 1–10 microsecond pulse, to a negative voltage, typically 1–20 kV, and drives an increased current, typically 1–100 amps, through the plasma channels 734. Ions of the working gas are accelerated toward plasma discharge region 740. During passage along plasma channel 734, the ions experience neutralizing collisions in a resonant charge exchange process and impinge on plasma discharge region 740 to form a dense plasma.

During a second phase of operation, power supply 752 applies a high current pulse, typically 0.1–10 microseconds and 1–100 kiloamps, between ring electrode 710 and second electrode 1110. The pulse from power supply 752 may be initiated during the pulse from power supply 750 or at most slightly after the end of the pulse from power supply 750. Thus, power supply 752 is typically triggered about 0.1–10 microseconds after power supply 750 is triggered. The circuit is completed through plasma channels 734. In the embodiment of FIGS. 11A and 11B, hollow ring electrode 710 constitutes a first electrode and electrode 1110 constitutes a second electrode for application of a heating current to the plasma in plasma discharge region 740. The high current from power supply 752 compresses and heats the plasma in plasma discharge region 740 so that it emits extreme ultraviolet or soft X-ray photons which propagate from inner shell 1100 through honeycomb structure 742 as photon beam 744 to be used in an application.

In the embodiment of FIGS. 11A and 11B, the anode and cathode are reversed during high current discharge relative to the embodiment of FIGS. 10A and 10B. This configuration keeps the output photon beam 744 pointing away from the cathode. This avoids a jet of ions that otherwise would accompany the photon beam. The anode is now the honeycomb structure 742 that the photon beam 744 passes through. An electron column 1130 may extend from plasma discharge region 740 to electrode 1110.

Figure 12:
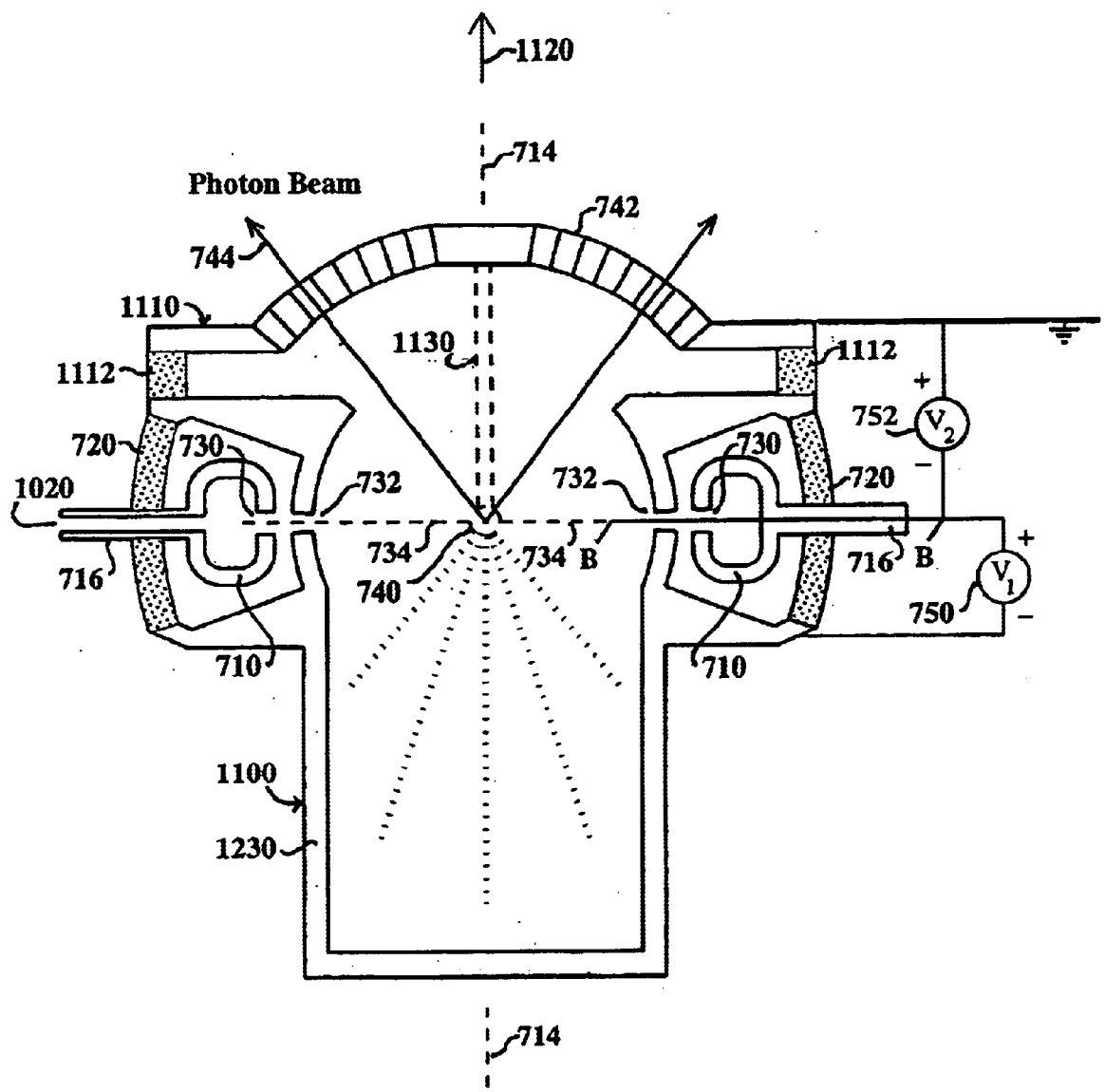
FIG. 12 is a cross-sectional side view of a ninth embodiment of a photon source in accordance with the invention.

A ninth embodiment of a photon source in accordance with the invention is shown in FIG. 12. FIG. 12 is a simplified cross-sectional side view of the photon source. Like elements in FIGS. 7–12 have the same reference numerals. The embodiment of FIG. 12 differs from the embodiment of FIGS. 11A and 11B by the addition of a receptacle 1230 at the lower end of inner shell 1100 for the accumulation of ions from plasma discharge region 40. Receptacle 1230 may have any desired size and shape and may be coupled to a vacuum system, as shown in FIG. 5 and described above.

Figure 13:
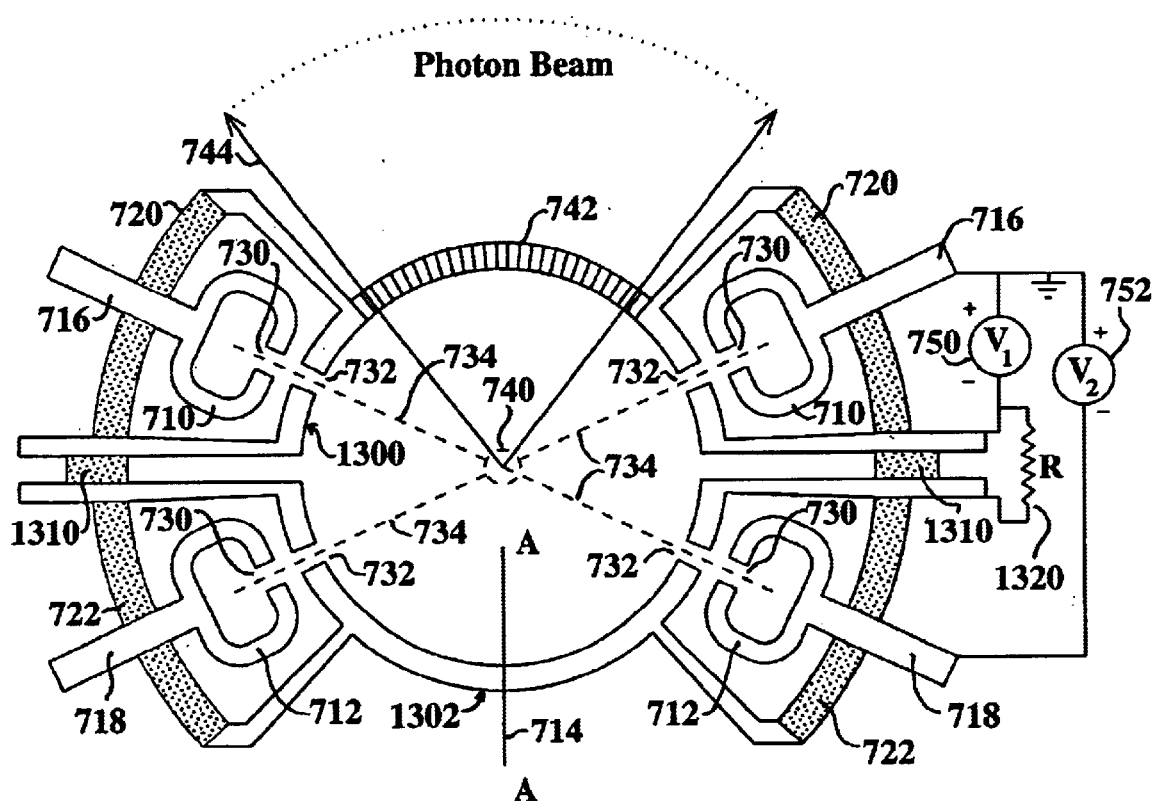
FIG. 13 is a cross-sectional side view of a tenth embodiment of a photon source in accordance with the invention.

A tenth embodiment of a photon source in accordance with the invention is shown in FIG. 13. FIG. 13 is a simplified cross-sectional side view of the photon source. Like elements in FIGS. 7–13 have the same reference numerals. The embodiment of FIG. 13 differs from the embodiment of FIG. 7 with respect to the configuration of the inner shell and the addition of a resistor. The photon source of FIG. 13 includes a first inner shell portion 1300 associated with ring electrode 710 and a second inner shell portion 1302 associated with ring electrode 712. Inner shell portions 1300 and 1302 are electrically isolated from each other by an insulator 1310. Each of the shell portions 1300 and 1302 may include a hemispherical portion and a flange portion. Shell portion 1300 may be provided with honeycomb structure 742 or other beam exit aperture. The hemispherical portions may be mounted together and spaced apart by insulator 1310 to form a spherical inner shell.

A resistor 1320 may be connected between shell portions 1300 and 1302. The value of resistor 1320 is selected to be high compared to the impedance of the plasma load on power supply 752 during the high current heating pulse. The purpose of resistor 1320 is to allow the shell portions 1300 and 1302 to float electrically with respect to each other during the high current pulse, but to prevent significant current from power supply 752 from bypassing the plasma through the inner shell walls.

Figure 14:
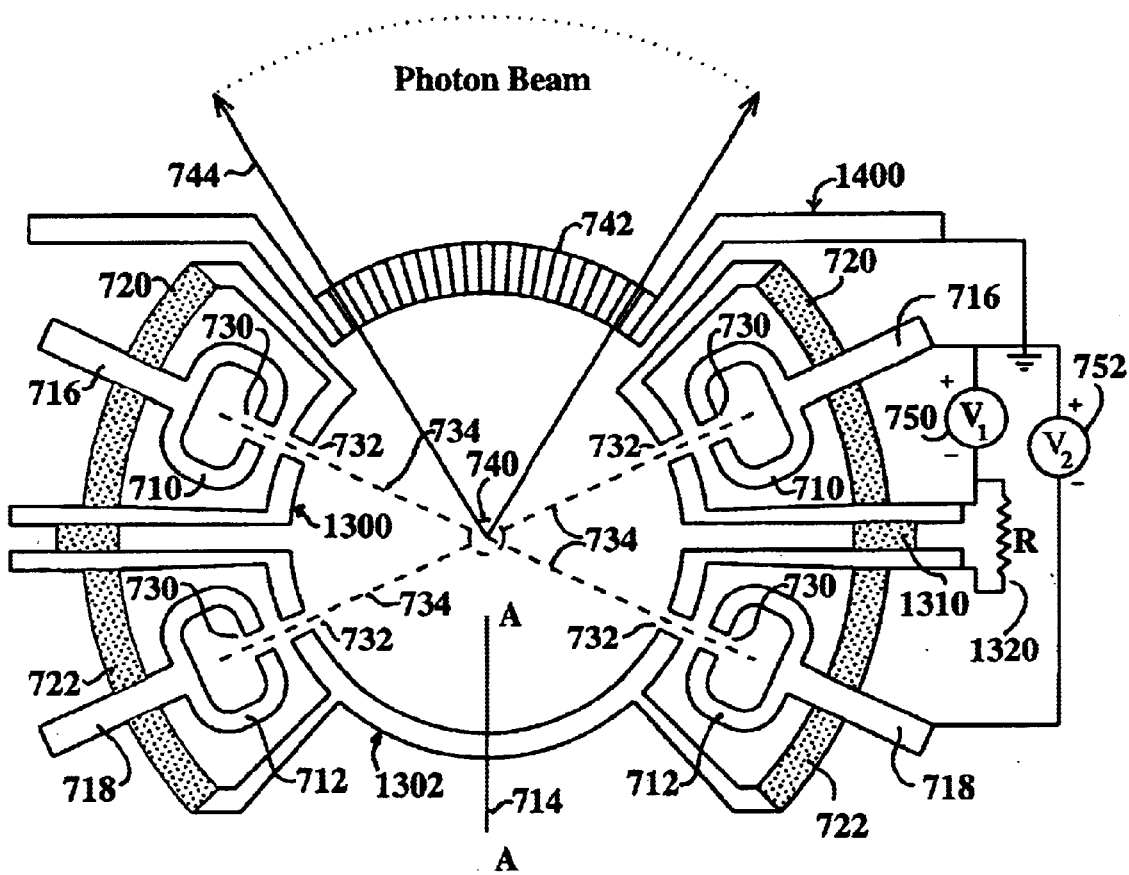
FIG. 14 is a cross-sectional side view of an eleventh embodiment of a photon source in accordance with the invention.

An eleventh embodiment of a photon source in accordance with the invention is shown in FIG. 14. FIG. 14 is a simplified cross-sectional side view of the photon source. Like elements in FIGS. 7–14 have the same reference numerals. The embodiment of FIG. 14 differs from the embodiment of FIG. 13 with respect to the configuration of the inner shell. The photon source of FIG. 14 includes first inner shell portion 1300 associated with ring electrode 710, second inner shell portion 1302 associated with ring electrode 712 and a third inner shell portion 1400. The third inner shell portion 1400 includes honeycomb structure 742 or other beam exit aperture and is connected to a reference potential, such as ground.

The hot and dense plasma that is created in the star pinch apparatus described herein can also be used for the production of neutrons. Neutrons may be emitted with an energy of 2.45 MeV upon the collision of two energetic deuterium ions. The ion density within the heated plasma may exceed $10^{20}$ ions $cm^{-3}$ for a period of the order of $10^{-6}$ seconds. Although existing experimental data with xenon in the star pinch apparatus indicates that a plasma temperature of only 50 eV has been achieved, future improvements to the density and temperature using the same principle should allow the deuterium plasma temperature to be raised to more than 1 keV, at which level D—D fusion reactions producing 2.45 MeV neutrons begin to become very plentiful.

The production of net fusion energy requires even higher plasma temperature, in the range of 10 keV, and the use of fusion reactants such as deuterium plus tritium, D+T, which have the highest fusion reaction cross section. The D–T reaction produces 14MeV neutrons plus an energetic charged particle. Many different plasma configurations have been studied intensively in the quest for fusion energy, including several types of plasma pinch. To date it has been difficult to approach fusion densities and temperatures in any type of plasma pinch, and that is expected to also be true of the star pinch apparatus. However, the advantages that the star pinch apparatus would have relative to other types of pinch in the economical generation of fusion power are the large distance between the heated plasma and the nearest solid surface, to absorb the plasma blast wave after a pulsed fusion reaction, and the capability for long duration repetitive operation because of low erosion rates on the distributed electrode.

While there have been shown and described what are at present considered the preferred embodiments of the present invention, it will be obvious to those skilled in the art that various changes and modifications may be made therein without departing from the scope of the invention as defined by the appended claims.

What is claimed:

1. A source of photons comprising:
    a housing that defines a discharge chamber;
    a first group of ion beam sources directed toward a plasma discharge region in the discharge chamber, said first group of ion beam sources comprising a first electrode and an inner shell that at least partially encloses the plasma discharge region;
    a second electrode spaced from the plasma discharge region;
    a first power supply for energizing the first group of ion beam sources to electrostatically accelerate, from the first group of ion beam sources toward the plasma discharge region, ion beams which are at least partially neutralized before they enter the plasma discharge region; and
    a second power supply coupled between the first and second electrodes for delivering a heating current to the plasma discharge region, wherein the ion beams and the heating current form a hot plasma that radiates photons.

2. A source of photons as defined in claim 1, wherein the ion beam sources of said first group of ion beam sources are distributed around the plasma discharge region.

3. A source of photons as defined in claim 1, wherein the ion beams precede the heating current.

4. A source of photons as defined in claim 1, wherein the heating current is pulsed and wherein the ion beams comprise pulsed ion beams that precede the pulsed heating current.

5. A source of photons as defined in claim 1, wherein the ion beams are continuous and wherein the heating current is pulsed.

6. A source of photons as defined in claim 1, wherein the ion beams are at least partially neutralized by resonant charge exchange.

7. A source of photons as defined in claim 1, wherein the radiated photons are in the soft X-ray or extreme ultraviolet wavelength range.

8. A source of photons as defined in claim 1, wherein the ion beams comprise xenon ions and wherein the radiated photons have wavelengths in a range of about 10–15 nanometers.

9. A source of photons as defined in claim 1, wherein the ion beams comprise ions of a working gas selected from the group consisting of xenon, hydrogen, lithium, helium, nitrogen, oxygen, neon, argon and krypton.

10. A source of photons as defined in claim 1, wherein said first electrode of ion beam sources comprises a first hollow ring electrode.

11. A source of photons as defined in claim 10, wherein said first power supply is connected between said first hollow ring electrode and said inner shell.

12. A source of photons as defined in claim 10, further comprising a second group of ion sources, said second group of ion sources comprising a second hollow ring electrode and said inner shell.

13. A source of photons as defined in claim 12, wherein said first power supply has a first terminal connected to said first and second hollow ring electrodes and a second terminal connected to said inner shell.

14. A source of photons as defined in claim 13, wherein said second power supply is connected between said first and second hollow ring electrodes.

15. A source of photons as defined in claim 10, wherein said first hollow ring electrode and said inner shell have a plurality of hole pairs which define plasma channels from the first hollow ring electrode to the plasma discharge region.

16. A source of photons as defined in claim 12, wherein said first hollow ring electrode and said inner shell have a plurality of hole pairs which define plasma channels from the first hollow ring electrode to the plasma discharge region and wherein said second hollow ring electrode and said inner shell have a plurality of hole pairs which define plasma channels from the second hollow ring electrode to the plasma discharge region.

17. A source of photons as defined in claim 10, wherein said second electrode comprises a cup electrode.

18. A source of photons as defined in claim 17, wherein said cup electrode is coupled to the plasma discharge region through a hole in said inner shell.

19. A source of photons as defined in claim 17, further comprising a ring electrode mounted within said cup electrode and a third power supply coupled between said ring electrode and said cup electrode.

20. A source of photons as defined in claim 17, wherein said cup electrode is coupled to the plasma discharge region through a relatively wide opening in the inner shell.

21. A source of photons as defined in claim 12, wherein said inner shell is divided into a first shell portion corresponding to said first hollow ring electrode and a second shell portion corresponding to said second hollow ring electrode, wherein said first and second shell portions are connected by a resistor having a value that is large in comparison with the impedance of the plasma during delivery of the heating current.

22. A source of photons as defined in claim 1, wherein said second electrode comprises a structure defining an aperture for emission of a photon beam from the plasma discharge region.

23. A source of photons as defined in claim 1, wherein a photon beam is emitted from the plasma discharge region in a beam direction and wherein said first group of ion beam sources comprises an annular array of ion beam sources distributed around the plasma discharge region in a plane perpendicular to the beam direction.

24. A source of photons as defined in claim 1, wherein said second power supply is triggered to deliver a heating current about 0.1 to 10 microseconds after said first power supply is triggered to energize said first group of ion beam sources.

25. A source of photons as defined in claim 1, further comprising a gas source for supplying a working gas to the discharge chamber, wherein the working gas is ionized to form the ion beams.

26. A source of photons as defined in claim 1, wherein said first and second electrodes are configured such that the heating current is conducted along the ion beams to the plasma discharge region.

27. A source of photons as defined in claim 1, wherein a photon beam is emitted from the plasma discharge region in a beam direction and wherein said second electrode is spaced from the plasma discharge region in the beam direction.

28. A source of photons as defined in claim 1, wherein said first group of ion beam sources comprises an inner shell that at least partially encloses the plasma discharge region, said inner shell including a shell portion having a beam exit aperture, wherein the shell portion is connected to a reference potential.

29. A system for generating photons, comprising:
a housing defining a discharge chamber;
a first group of ion beam sources directed toward a plasma discharge region in the discharge chamber, said first group of ion beam sources comprising a first electrode and an inner shell that at least partially encloses the plasma discharge region;
a second electrode spaced from the plasma discharge region;
a first power supply for energizing the first group of ion beam sources to accelerate, from the first group of ion beam sources toward the plasma discharge region, beams of ions of a working gas, wherein the ions are at least partially neutralized before they enter the plasma discharge region;
a second power supply coupled between the first and second electrodes for delivering a heating current to the plasma discharge region;
a gas source for supplying the working gas to the discharge chamber; and
a vacuum system for controlling the pressure of the working gas in the discharge chamber.

30. A source of neutrons comprising:
a housing that defines a discharge chamber;
a first group of ion beam sources directed toward a plasma discharge region in the discharge chamber, wherein a component of said first group of ion beam sources constitutes a first electrode;
a second electrode spaced from the plasma discharge region;
a first power supply for energizing the first group of ion beam sources to electrostatically accelerate, from the first group of ion beam sources toward the plasma discharge region, ion beams which are at least partially neutralized before they enter the plasma discharge region; and
a second power supply coupled between the first and second electrodes for delivering a heating current to the plasma discharge region, wherein the ion beams and the heating current form a hot plasma that radiates neutrons.

31. A source of neutrons as defined in claim 30, further comprising a second group of ion beam sources directed toward the plasma discharge region, wherein a component of said second group of ion beam sources constitutes said second electrode.

* * * * *